(12) United States Patent
Ohkawa

(10) Patent No.: US 6,204,510 B1
(45) Date of Patent: Mar. 20, 2001

(54) DEVICE AND METHOD FOR ION ACCELERATION

(75) Inventor: Tihiro Ohkawa, La Jolla, CA (US)

(73) Assignee: Archimedes Technology Group, Inc., San Diego, CA (US)

( * ) Notice: Subject to any disclaimer, the term of this patent is extended or adjusted under 35 U.S.C. 154(b) by 0 days.

(21) Appl. No.: 09/215,976

(22) Filed: Dec. 18, 1998

(51) Int. Cl.[7] ....................................................... H01J 49/42
(52) U.S. Cl. .................................. 250/492.21; 250/492.2; 250/492.3; 250/423 R; 250/281; 250/282; 315/111.21; 315/111.61
(58) Field of Search ..................... 250/492.21, 492.2, 250/492.3, 423 R, 281, 282; 315/111.21, 111.61

(56) References Cited

U.S. PATENT DOCUMENTS

| | | |
|---|---|---|
| 4,987,007 | 1/1991 | Wagal et al. . |
| 5,039,312 | 8/1991 | Hollis, Jr. et al. . |
| 5,225,740 | 7/1993 | Ohkawa . |
| 5,350,454 | 9/1994 | Ohkawa . |
| 5,478,608 | 12/1995 | Gorokhovsky . |
| 5,616,919 * | 4/1997 | Broadbent et al. .................. 250/292 |
| 5,681,434 | 10/1997 | Eastlund . |
| 5,868,909 | 2/1999 | Eastlund . |

OTHER PUBLICATIONS

Ohkawa, T., et al., Plasma Confinement in a Toroidal Quadrupole, Physics of Fluids, 12, p. 1926 (1969).
Ohkawa T., et al., Plasma Confinement in D.C. Octopole, Phys Rev. Letters 24, p. 95 (1970).

* cited by examiner

Primary Examiner—Jack Berman
Assistant Examiner—Nikita Wells
(74) Attorney, Agent, or Firm—Nydegger & Associates

(57) ABSTRACT

An apparatus for altering the surface of a substrate includes a housing that is formed with an enclosed chamber having a first end and a second end. The chamber defines a longitudinal axis extending between the ends, and the substrate is positioned near the second end. A set of conductors are mounted in the chamber parallel to the longitudinal axis, and each conductor carries a current to establish a magnetic field (B) in said chamber. A first casing and a second casing surround each conductor with time alternating voltages being applied on the set of first casings to generate a plasma. The second casings are electrically insulated from a respective first casing so that a dc voltage can be applied to the second casings in a manner which ensures the potential of the resultant electric field (E) in the chamber is proportional to the magnetic flux. The electric field so produced is thereby crossed with the magnetic field (E×B) to uniformly accelerate plasma ions in a direction substantially parallel to the longitudinal axis from the first end toward the second end of the chamber to impact and thereby alter the substrate surface.

19 Claims, 1 Drawing Sheet

DEVICE AND METHOD FOR ION ACCELERATION

FIELD OF THE INVENTION

The present invention pertains generally to apparatus which will accelerate ions of a plasma in a predetermined direction. More specifically, the present invention pertains to apparatus which generate plasmas for use in altering the surface of a substrate by deposition or etching. The present invention is particularly, but not exclusively, useful as an apparatus which will accelerate ions in a plasma to a common translational velocity.

BACKGROUND OF THE INVENTION

It is well known that plasmas can be generated and used for altering substrate surfaces through either deposition or etching processes. In etching processes, the depth of the etching into the substrate surface can be an important consideration. On the other hand, in deposition processes, the resultant build-up on a substrate surface can be an important consideration. For instance, the operational applications of many of the high-performance chips and wafers require that the etching or deposition depths be uniformly controlled. It happens, however, that some substrate surfaces will be more resistive to an etching action than will others, and that some substrate surfaces can be more easily worked with during a deposition than others. Accordingly, the differences between substrate materials, and the eventual operational requirements of the etched substrate, must be accounted for. Stated differently, it is desirable to have as much control over the rate and effect of a plasma etching or deposition process as is possible.

One method for controlling ion bombardment of a substrate surface is to control the velocity at which ions impact against the substrate surface. Control of this velocity can be accomplished by controlling the acceleration of the ions. Practical aspects, however, require that the apparatus used to accomplish acceleration control be physically robust and technically precise.

In light of the above, it is an object of the present invention to provide an apparatus and method for altering a substrate surface which is capable of taking all ions in a plasma to a common translational velocity regardless of their initial boundary conditions. It is another object of the present invention to provide an apparatus and method for altering a substrate surface which is capable of controlling, establishing, and maintaining the common translational velocity of ions in a plasma. Yet another object of the present invention is to provide an apparatus and method for altering a substrate surface which is relatively, technically uncomplicated, and which has minimal components for generating crossed electric and magnetic fields inside a vacuum vessel chamber. Still another object of the present invention is to provide an apparatus and method for altering a substrate surface which is simple to manufacture, easy to use, and comparatively cost effective.

SUMMARY OF THE PREFERRED EMBODIMENTS

An apparatus and method for altering a substrate surface includes a housing which is formed with an enclosed chamber and which has a first end and a second end. Further, the chamber defines a longitudinal axis which extends from the first end to the second end. The substrate that is to be altered by the apparatus can then be positioned in the chamber and the surface of the substrate exposed to the interior of the chamber.

The apparatus of the present invention also includes at least one pair, but preferably multiple pairs, of elongated co-planar juxtaposed conductors which are mounted in the chamber and which are aligned substantially parallel to the longitudinal axis of the chamber. In their operation, each of these conductors carries a current, and together, they establish a magnetic field (B) in the chamber. A consequence of this configuration is that the magnetic field is oriented substantially perpendicular to the longitudinal axis of the chamber.

In addition to the conductors, the apparatus of the present invention includes two sets of casings which are separated from each other by a dielectric material. One set of these casings, the first set, is near the first end of the chamber while the second set is nearer the second end of the chamber. Each casing, however, in both the first set and the second set will respectively surround one of the conductors.

For the operation of the casings of the first set, opposite polarity, time alternating voltages are applied to adjacent casings in the set to induce an electron flow in the magnetic field. As is well known, these opposite polarity, time alternating voltages will generate a plasma. As is also well known in the pertinent art, the plurality of ions in the resulting plasma are useful for altering the substrate surface.

For the second set of casings, each casing in the second set, like the casings of the first set, surround a respective conductor. As indicated above, each of the casings in this second set is electrically insulated from a respective casing of the first set by a dielectric insulator. This insulation allows a dc voltage to be placed on the casings of the second set which will establish an electric field (E) in the chamber. Importantly, this electric field is crossed with the magnetic field (E×B) to establish crossed electric and magnetic fields. The crossed electric and magnetic fields will then accelerate ions in the plasma in a direction that is substantially parallel to the longitudinal axis of the chamber. Specifically, the ions in the crossed electric magnetic fields are accelerated from the first end of the chamber toward the second end of the chamber to impact against the substrate surface.

An additional aspect of the present invention is that the ratio of the electric field to the magnetic field (E/B) is preferably established so as to be constant or uniform throughout the chamber. This can be effectively accomplished by applying the electrostatic potentials to the ring casings in a manner that ensures the potential is constant on a magnetic flux surface. The object of the uniform ratio E/B in the chamber is to accelerate ions to a common translational velocity prior to their impact with the substrate surface.

During operation of the apparatus of the present invention, the substrate surface can be rotated in the chamber about the longitudinal axis of the chamber. Such rotation may be desirable due to the configuration and orientation of the magnetic lines in the magnetic field B. Specifically, as noted above, the magnetic field lines will lie in a plane that is substantially perpendicular to the longitudinal axis of the chamber. Further, these magnetic field lines will either encircle one of the conductors or they will be enclosed, contiguous and somewhat oblong around all of the conductors. A consequence of this geometry can be that there is an increased ion density in one direction as opposed to another direction, particularly for only two conductors. In order to compensate for this it may be determined to rotate the substrate. If done, such a rotation will tend to neutralize any variation in ion density that may develop due to the configuration of magnetic field lines relative to the direction of ion acceleration in the chamber. Also, employing multiple conductors will result in a radial profile of ion density that is nearly flat in the center, thus ensuring uniform ion flux.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION OF THE PREFERRED EMBODIMENT

Figure 1:
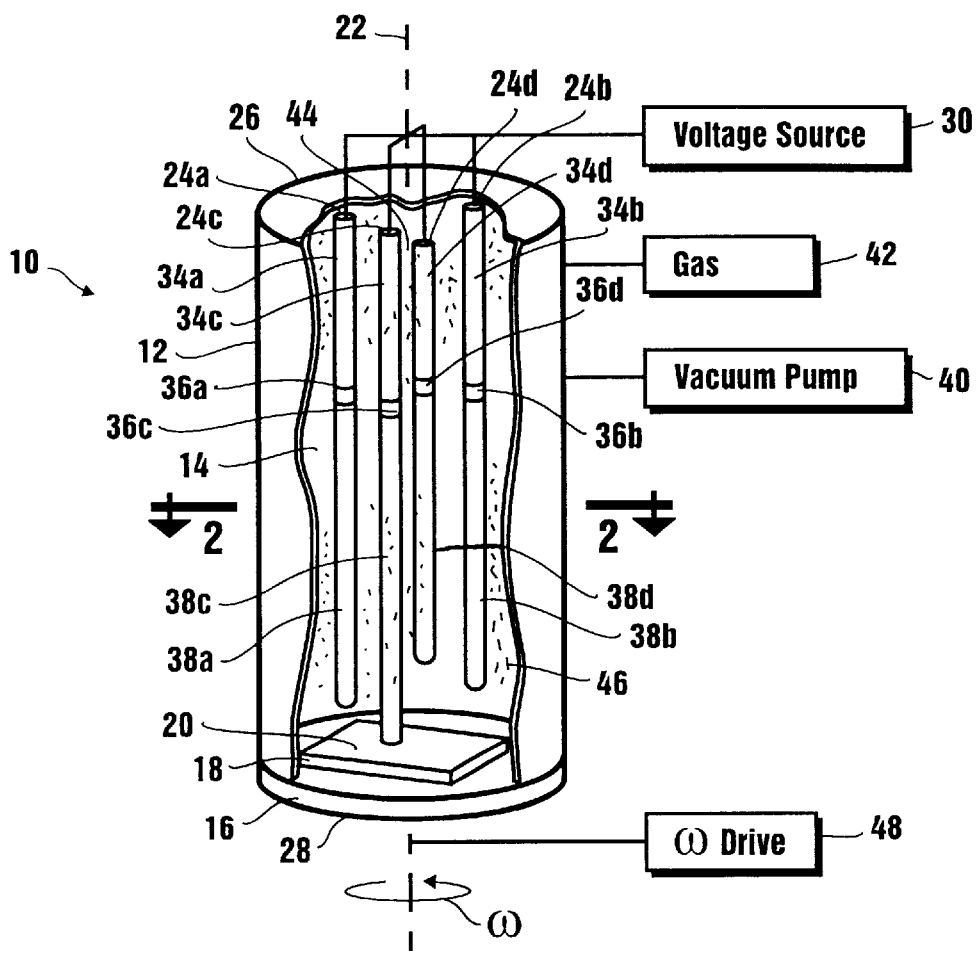
FIG. 1 is a front perspective view of the apparatus of the present invention.

Referring initially to FIG. 1, an apparatus for altering a substrate surface in accordance with the present invention is shown and generally designated 10. As shown, the apparatus 10 includes a housing 12 which forms an enclosed chamber 14. A platform 16 is also shown as part of the apparatus 10 and a substrate 18 is shown positioned on the platform 16. As so positioned, a surface 20 of the substrate 18 is exposed into the chamber 14. Within the contemplation of the present invention it will be appreciated that the housing 12 can be any one of several different configurations. For purposes of this disclosure, however, the housing 12 is shown as a generally hollow, cylindrical structure which defines a longitudinal axis 22.

Figure 2:
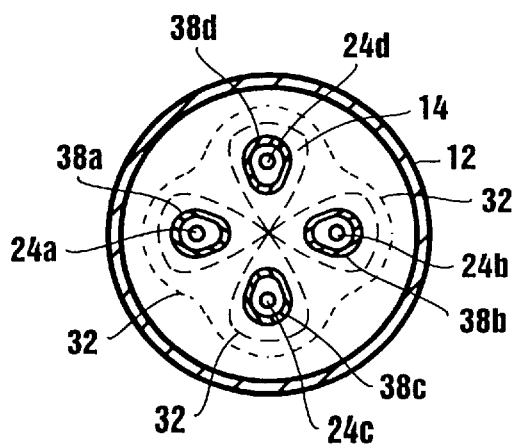
FIG. 2 is a cross sectional view of the apparatus as seen along the line 2—2 in FIG. 1.

By cross referencing FIG. 1 and FIG. 2 it will be appreciated that a set (four) of substantially parallel conductors 24a–d are mounted in the chamber 14. More specifically, the conductors 24a–d are aligned substantially parallel to the longitudinal axis 22 of the chamber 14 and extend from a first end 26 of the chamber 14, toward a second end 28 thereof through substantially the entire length of the chamber 14. FIG. 1 also indicates that the conductors 24a–d are each electrically connected with a voltage source 30 which runs a current through the conductors 24a–d. Thus, a magnetic field B is established in the chamber 14. The magnetic field lines 32 shown in FIG. 2 are representative of the field lines in this magnetic field.

Still referring to both FIG. 1 and FIG. 2, it is to be appreciated that a set of casings 34a–d respectively surround the conductors 24a–d in the upper portion of the chamber 14 near the first end 26. Further, there is a set of insulators 36a–d which separate this set of casings 34a–d from another set of casings 38a–d which surround the conductors 24a–d in the lower portion of the chamber 14 near the second end 28. As indicated in FIG. 1, all casings (i.e. casings 34a–d and casings 38a–d) are electrically connected with a voltage source, such as the voltage source 30, but for different purposes. To do that, voltage source 30 may actually be served different sources and different types (ac-dc) of sources. Specifically, the casings 34a–d in the upper portion of chamber 14 near end 26 are used to establish an ionizer in the chamber 14. To do this, opposite polarity voltages are supplied to each of the casings 34a–d and are alternated in time to induce an electron flow in the magnetic field, B, which will interact with a neutral gas to create a plasma. For example, when the casing 34a and b are positive, the casing 34c and d will be negative, and vice versa. On the other hand, all of the casings 38a–d in the lower portion of chamber 14 near end 28 are each supplied with a substantially constant dc voltage to establish an electric field, E, in the chamber 14.

For the present invention, a voltage source, such as voltage source 30, can be used to vary the current on conductors 24a–d to establish the magnetic field, B. Further, a voltage source will be used to vary the voltage on casings 38a–d to establish the electric field, E. Importantly, it necessary that potential be maintained constant on a magnetic flux surface in order to obtain a ratio E/B which will be substantially uniform throughout the chamber 14. Further, as indicated in FIG. 2, and as will be appreciated by the skilled artisan, the shape of casings 38a–d can be varied to ensure that the electric field, E, will cross with the magnetic field, B.

In the operation of the apparatus 10 of the present invention, the substrate 18 is first positioned in the chamber 14 substantially as shown. A vacuum pump 40 is then activated to draw a vacuum in the chamber 14. Next, the voltage source 30 is activated to drive a current through the conductors 24a–d to thereby establish a magnetic field, B, in the chamber 14. Additionally, a dc voltage is placed on the casings 38a–d to establish an electric field, E, in the chamber 14 which is crossed with the magnetic field B. More specifically, the electrical field (E) is established in a manner which ensures the electric potential is proportional to the magnetic flux substantially everywhere in the chamber 14 so that its resulting electric field (E) is effectively crossed with the magnetic field (B).

With a vacuum drawn, and with the conductors 24a–d and the casings 38a–d activated, a neutral gas is introduced into the chamber 14 from a gas source 42. After the neutral gas is in the chamber 14, the voltage source 30 is activated to alternately apply opposite voltages to the respective casings 34a–d. In a manner well known to the skilled artisan, by alternating the voltages on these casings 34a–d, an electron flow is induced in the magnetic field which interacts with the neutral gas to create a plasma 44. Depending on which neutral gas is used, a particular type of ion will be produced. Regardless of the of type ion that is produced, however, the crossed electric and magnetic fields will accelerate the ions 46 of the plasma 44 toward the surface 20 of substrate 18.

In accordance with the desires and requirements of the operator, a mask (not shown) can be pre-positioned on the surface 20 of the substrate 18 to shield the surface 20 from the bombardment of ions 46. Accordingly, a deposition of ions 46, or an etching by the ions 46, can occur on the unmasked portions of the surface 20. Also, for reasons set forth above, a rotational drive 48 can be operated to rotate the substrate 18 about the axis 22.

While the particular Device and Method for Ion Acceleration as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An apparatus for altering a substrate surface which comprises:

a housing formed with an enclosed chamber;

platform for holding said substrate surface in said chamber;

an ionizer mounted on said housing in said chamber for creating a plasma, said plasma having a plurality of ions; and an accelerator mounted on said housing in said chamber for directing said ions from said ionizer toward said substrate surface, and for accelerating said ions to a common translational velocity prior to impact of said ions into said substrate surface; and wherein said accelerator comprises:
- a set of substantially parallel conductors aligned for carrying a current to establish a magnetic field (B) in said chamber; and
- a set of casings, each said casing surrounding a respective said conductor to establish an electric field (E) in said accelerator, the electric field being crossed with the magnetic field (E×B) to accelerate said ions to said common translational velocity; and further wherein said ionizer comprises:
- means for injecting a neutral gas into said ionizer; and
- a set of casings, each said casing surrounding a respective said conductor in said ionizer;
- a set of insulators, each said insulator surrounding a respective said conductor for electrically isolating said casings of said ionizer from said casings of said accelerator.

2. An apparatus as recited in claim 1 wherein the ratio of E to B is uniform in said chamber to accelerate ions to said common translational velocity.

3. An apparatus as recited in claim 2 further comprising means for varying the electric field (E).

4. An apparatus as recited in claim 2 further comprising means for varying the magnetic field (B).

5. An apparatus as recited in claim 1 wherein said ionizer comprises:
- means for injecting a neutral gas into said ionizer; and
- a voltage means for applying opposite polarity voltages on each said casing of said ionizer and for alternating said voltages in time thereon to induce an electron flow in said magnetic field to interact with said neutral gas to create said plasma.

6. An apparatus as recited in claim 5 further comprising a dielectric material positioned between each said casing of said ionizer and said conductor and between each said casing of said accelerator and said conductor to electrically isolate said casings of said ionizer and said casings of said accelerator from said conductors.

7. An apparatus as recited in claim 1 further comprising means for rotating said platform in said chamber.

8. An apparatus as recited in claim 1 further comprising a vacuum pump connected in fluid communication with said housing for creating a vacuum in said chamber.

9. An apparatus for altering a substrate surface which comprises:
- a housing formed with an enclosed chamber, said chamber having a first end and a second end and defining a longitudinal axis extending therebetween, said substrate surface being positioned in said chamber near said second end thereof;
- a set of elongated conductors, said conductors being juxtaposed and mounted in said chamber substantially parallel to said longitudinal axis, with each said conductor carrying a current to establish a magnetic field (B) in said chamber;
- a first set of casings surrounding a respective said conductor with alternating voltages being applied thereon to induce an electron flow in said magnetic field to generate a plasma having a plurality of ions; and
- a second set of casings surrounding respective said conductors, with each of said second set of casings being electrically insulated from a respective casing of said first set of casings, said second set of casings establishing an electric field (E) with the electric field being crossed with the magnetic field (E×B) to uniformly accelerate said ions in a direction substantially parallel to said longitudinal axis from said first end toward said second end of said chamber to impact said substrate surface.

10. An apparatus as recited in claim 9 wherein the ratio of E to B is uniform in said chamber to accelerate ions to a common translational velocity.

11. An apparatus as recited in claim 9 further comprising means for varying the electric field (E).

12. An apparatus as recited in claim 9 further comprising means for varying the magnetic field (B).

13. An apparatus as recited in claim 9 further comprising a dielectric material positioned between each said casing of said first set and a respective casing of said second set to electrically isolate said casings of said ionizer from said casings of said accelerator.

14. An apparatus as recited in claim 9 further comprising a dielectric material positioned between each said casing of said ionizer and said conductor and between each said casing of said accelerator and said conductor to electrically isolate said casings of said ionizer and said casings of said accelerator from said conductors.

15. An apparatus as recited in claim 9 further comprising a vacuum pump connected in fluid communication with said housing for creating a vacuum in said chamber.

16. An apparatus as recited in claim 9 further comprising means for rotating said platform in said chamber.

17. A method for altering a substrate surface which comprises the steps of:
- providing a housing formed with an enclosed chamber, said chamber having a first end and a second end and defining a longitudinal axis extending therebetween, said substrate surface being positioned in said chamber near said second end thereof;
- mounting a set of elongated conductors in said chamber, said conductors being juxtaposed substantially parallel to said longitudinal axis, with each said conductor carrying a current to establish a magnetic field (B) in said chamber;
- surrounding each respective said conductor with a first casing and alternating voltages applied thereon to induce an electron flow in said magnetic field to generate a plasma having a plurality of ions; and
- surrounding each respective said conductor with a second casing, said second casings being electrically insulated from a respective first casing to establish an electric field (E), with the electric field being crossed with the magnetic field (E×B) to accelerate said ions in a direction substantially parallel to said longitudinal axis from said first end toward said second end of said chamber to impact said substrate surface.

18. A method as recited in claim 17 further comprising the step of substrate surface in said chamber.

19. A method as recited in claim 17 further comprising the step of establishing the ratio of E to B uniform in said chamber to accelerate ions to said common translational velocity.

* * * * *